(12) United States Patent
Bloching et al.

(10) Patent No.: US 7,030,541 B2
(45) Date of Patent: Apr. 18, 2006

(54) ACTUATOR ACTING AS A DRIVE UNIT FOR AN INJECTOR AND METHOD FOR THE PRODUCTION OF SAID INJECTOR

(75) Inventors: Wolfgang Bloching, Langenargen (DE); Jürgen Dick, Laaber (DE); Willibald Schürz, Pielenhofen (DE); Martin Simmet, Bad Abbach (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 10/780,016

(22) Filed: Feb. 17, 2004

(65) Prior Publication Data

US 2004/0169443 A1    Sep. 2, 2004

Related U.S. Application Data

(63) Continuation of application No. PCT/EP02/09178, filed on Aug. 16, 2002.

(30) Foreign Application Priority Data

Aug. 17, 2001  (DE)  ................. 101 40 530

(51) Int. Cl.
*H01L 41/08*  (2006.01)
(52) U.S. Cl. ............. 310/328; 251/129.06; 239/585.01
(58) Field of Classification Search ................ 310/328; 251/129.06, 33; 239/102.2, 585.01, 585.02, 239/285.03, 285.04, 285.05
See application file for complete search history.

(56) References Cited

U.S. PATENT DOCUMENTS

| 3,733,661 | A | * | 5/1973 | Zieringer | .................... 29/25.35 |
| 4,974,780 | A | * | 12/1990 | Nakamura et al. | ........ 239/102.2 |
| 5,334,902 | A | * | 8/1994 | Inoi | ............................ 310/344 |
| 6,279,842 | B1 | * | 8/2001 | Spain | ....................... 239/585.1 |
| 6,311,950 | B1 | * | 11/2001 | Kappel et al. | .......... 251/129.06 |

FOREIGN PATENT DOCUMENTS

| DE | 35 40 660 A1 | 5/1987 |
| DE | 36 29 646 A1 | 3/1988 |
| DE | 38 17 947 A1 | 11/1989 |
| DE | 44 28 309 A1 | 3/1995 |
| DE | 197 44 762 A1 | 10/1998 |
| DE | 198 26 341 A1 | 12/1999 |
| DE | 198 58 085 C1 | 3/2000 |
| DE | 198 32 826 C2 | 8/2000 |
| DE | 199 58 704 A1 | 7/2001 |

* cited by examiner

*Primary Examiner*—Mark Budd
(74) *Attorney, Agent, or Firm*—Baker Botts L.L.P.

(57) ABSTRACT

An actuator (1) acts as a drive unit for an injector, especially for an accumulator injection system. The actuator comprises a piezostack (3) disposed in a tube spring, a top plate (2) and a bottom plate. The top plate (2) of the actuator is directly fixed to the injector housing (7) by means of caulked areas. The caulking enables the injector to be produced in a simple and economical manner.

5 Claims, 3 Drawing Sheets

A-A

Detail X

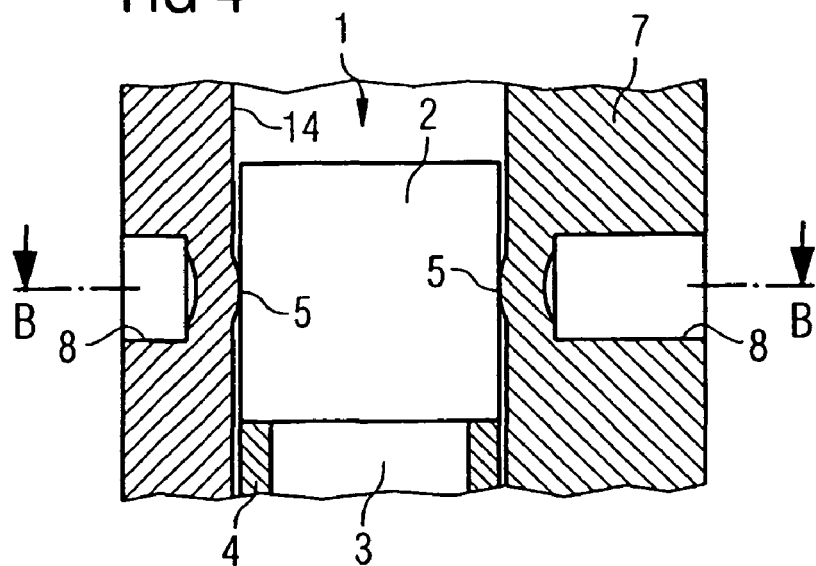
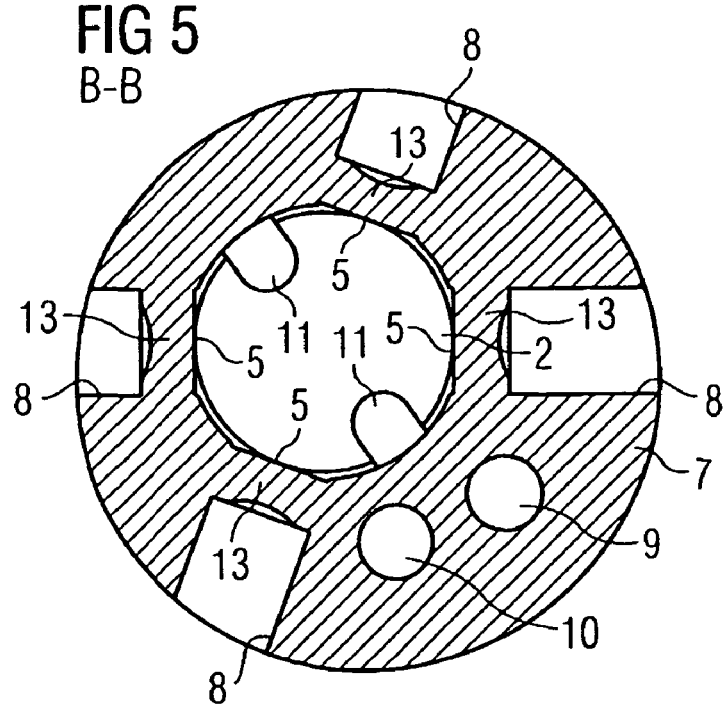

ACTUATOR ACTING AS A DRIVE UNIT FOR AN INJECTOR AND METHOD FOR THE PRODUCTION OF SAID INJECTOR

CROSS REFERENCE TO RELATED APPLICATION

This application is a continuation of copending International Application No. PCT/EP02/09178 filed Aug. 16, 2002 which designates the United States, and claims priority to German application no. 101 40 530.8 filed Aug. 17, 2001.

TECHNICAL FIELD OF THE INVENTION

The present invention relates to an actuator acting as a drive unit for an injector, especially an accumulator injection system, whereby the actuator comprises a piezostack disposed in a tube spring, a top plate and a bottom plate. The present invention also relates to a method for the production of said actuator and especially an assembly method for assembling the actuator in an injector.

DESCRIPTION OF THE RELATED ART

Actuators acting as drive units for an injector that use a piezostack are known in various embodiments from the prior art. With the currently known injectors, the actuator is configured as a module comprising the piezostack, a top plate, a bottom plate, a tube spring and a separate housing. The module is screwed onto the injector housing to fix said actuator module to the actual injector.

Generally the top plate is welded to the actuator housing to fix the actuator module in said actuator housing. In this process the existing manufacturing tolerances of the piezoactuator, e.g. the length of the piezostack, are compensated for by welding the top plate in position in the actuator housing and then surface grinding the bottom plate of the actuator together with the actuator housing of the piezoactuator welded into it. With known actuators it is a disadvantage on the one hand that said surface grinding of the assembled actuator in the housing requires an additional work stage and that the actuator is subjected to unwanted loading due to the additional production stage. Also the welding process requires that a weldable steel is used for the top plate and the actuator housing. This means that the actuator is also subjected to unwanted thermal loading and problems can occur especially at the weld seam. The known arrangement of the actuator also requires a relatively large amount of space.

SUMMARY OF THE INVENTION

It is therefore the object of the present invention to provide an actuator acting as a drive unit for an injector that has a simpler and economical structure. It is also the object of the present invention to provide an improved method for the production of said injector.

This object can be achieved by an actuator acting as a drive unit for an injector, especially for an accumulator injection system, comprising a piezostack disposed in a tube spring, a top plate and a bottom plate, wherein the top plate of the actuator is fixed directly to an injector housing by means of caulked areas.

The caulked areas can be disposed on the sides of the top plate. The caulked areas can be disposed on the upper area of the top plate. The caulked areas can be disposed radially in respect of the outer periphery of the top plate. The caulked areas can be disposed essentially tangentially in respect of the outer periphery of the top plate. The caulked areas can be formed from the material of the injector housing. The caulked areas can be formed from a filler material. A surface structure can be configured on the top plate with a suitable profile depth for caulking. The surface structure on the top plate can be configured as partially or wholly circumferential grooves. The top plate can be configured as a cylinder and the surface structure on the top plate is configured as an external thread. The connection between the top plate and the injector housing can be formed by four caulked areas. The four caulked areas can be disposed in such a way that two caulked areas lie opposite each other on the top plate in each instance. The top plate and/or the injector housing can be made of a tempering steel. 42CrMo4 can be used as the tempering steel. Cutouts can be provided in the injector housing, at which the caulked areas are disposed. The cutouts may serve as anchorage points for an electric plug-type connection of the actuator. The electrical plug-type connection can be configured as a plastic extrusion coating.

The object can also be achieved by a method for producing an injector with an actuator, whereby the assembly of the actuator to activate the injector in an injector housing comprises the following steps:

Pre-assembly of the actuator comprising a piezostack disposed in a tube spring, a top plate and a bottom plate, Positioning of the pre-assembled actuator in the injector housing by lining up the actuator, especially by lining up the bottom plate with its predefined position and Fixing the actuator on the injector housing by means of caulking between the top plate and the injector housing.

The material of the top plate and/or the material of the injector housing and/or a filler material can be used for caulking. Cutouts can be formed in the injector housing for caulking and these can be used after caulking to anchor a plastic injected electrical plug-type connection.

The actuator according to the invention acting as a drive unit for an injector has the advantage that it is integrated into the injector housing. As a result the actuator according to the invention has a simple structure and a smaller number of parts. There is especially no need for the actuator housing used in the prior art. The actuator according to the invention is also very simple and economical to produce, as the top plate of the actuator is fixed directly to the injector housing by means of caulked areas. This means there is no need for the expensive welding used in the prior art to fix the actuator. Also according to the invention it is possible to fix the actuator in the optimum position in the injector housing. For this the actuator is positioned in its predefined position in the injector housing before caulking and then fixed by caulking. This means on the one hand that there is no need for expensive reworking of the bottom plate of the actuator and on the other hand positioning and subsequent fixing by means of the caulked areas means that there is no disadvantageous cumulative effect of tolerances due to production at the injector. For this the top plate of the actuator is fixed directly to the injector housing by means of one or a plurality of caulked areas. As there is then no need for the welding used in the prior art, a tempering steel can be used for the injector housing instead of a case-hardened steel, resulting in significant cost benefits for the injector housing due to the simplified production method (no multistage heat treatment required). Because there is no need for an actuator housing, the actuator can have a smaller maximum external diameter, so the overall dimensions of the injector can be reduced compared with the prior art and the injector can have a more compact structure.

The caulked areas are preferably disposed on the sides of the top plate of the actuator. This means that a simple caulking process can be implemented, for example using extrusion dies fed through the sides of the injector housing.

According to another preferred embodiment of the present invention the caulked areas are disposed on the upper, i.e. outward facing area of the top plate. It should be noted that the caulked areas can be disposed both on the upper area of the top plate and also on the sides of the top plate.

It is especially preferable for the caulked areas to be disposed radially or essentially tangentially in respect of the outer periphery of the top plate. With a tangential disposition of the caulked areas in respect of the outer periphery of the top plate especially a particularly high level of holding force can be achieved for the top plate after caulking, as a wedge-shaped caulked area of material results at the caulked areas after caulking. This wedge-shaped area of material abuts outwards with the injector housing and inwards with the top plate. The advantageous effect of the wedge-shaped caulking is thereby also maintained after the caulking process.

In order to have the smallest number of parts possible, the caulked areas are preferably made from the material of the injector housing. Blind holes can for example be provided on the injector housing for this purpose, whereby the material at the end of the blind hole is used for caulking with the top plate of the actuator.

According to another preferred embodiment of the present invention, the caulked areas are made from a filler material. It is then possible to select said filler material in such a way that it can satisfy the best possible requirements in respect of caulking. This gives a greater degree of freedom in respect of selection of material for the injector housing, as the material of the injector housing is no longer directly used for caulking. The filler material for caulking can for example be positioned in through-holes that are configured in the injector housing and are caulked using extrusion dies.

To allow a particularly reliable and secure connection at the caulked areas, a surface structure with a suitable profile depth for caulking is configured on the sides of the top plate of the actuator. This ensures that during caulking the caulking material is pressed into the recesses of the surface structure thereby guaranteeing that the top plate is fixed securely by caulking.

It is especially preferable for the surface structure on the top plate to be configured as partially or wholly circumferential grooves. This means that the surface structure can then be produced relatively economically. It should be noted that the surface structure can be formed over the entire height of the top plate or even only in the area of the caulked areas. According to an especially preferred embodiment of the present invention the surface structure is configured on a cylindrical top plate as a thread. This means that the surface structure is especially economical to produce, by simply providing an external thread on the cylindrical top plate.

The connection between the top plate and the injector housing is preferably formed by four caulked areas. It is especially preferable for the four caulked areas to be thereby disposed so that two caulked areas lie opposite other in each instance. This results in an especially favorable application and distribution of forces on the top plate. It can also prevent unwanted deformation of the top plate during caulking.

So that they can be produced as economically as possible, the top plate and/or the injector housing are made of a tempering steel. It is especially preferable for tempering steel 42CrMo4 to be used. A cold extruding steel such as Cq45 is preferably used as the filler material for caulking.

Cutouts are advantageously provided in the injector housing, at which the caulked areas are disposed. The cutouts can thereby be configured as through-holes or blind-holes. It is especially preferable if after caulking the cutouts also serve as an anchorage point for an electric plug-type connection of the actuator. The plug-type connection is then fixed to the cutouts after the top plate of the actuator has been caulked to the injector housing. It is especially preferable if the electric plug-type connection is thereby formed by a plastic extrusion coating operation, whereby the plastic fed into the cutouts forms the anchorage point. Also the caulked areas are thereby effectively encapsulated by the plastic so that corrosion cannot occur at such points.

With the method according to the invention for the production of an injector with an actuator, the assembly of the actuator in an injection housing comprises the following stages. First the actuator comprising a piezostack disposed in a tube spring, a top plate and a bottom plate is pre-assembled. The pre-assembled actuator is then positioned in an injector housing, by lining the bottom plate up with its predefined position in the injector housing. The actuator is then fixed to the injector housing by caulking between the top plate and the injector housing. The material of the injector housing and/or the top plate and/or an additional caulking material can be used for caulking.

The method for the production of an injection preferably also includes the stage of injecting the plastic for an electric plug-type connection on the injector housing, whereby the electric plug-type connection is anchored in cutouts in the injector housing, that are used for the caulking operation.

BRIEF DESCRIPTION OF THE DRAWINGS

The invention is described below with reference to preferred embodiments in conjunction with the drawing, in which:

FIG. 4 shows a schematic sectional view of an actuator according to a second exemplary embodiment of the present invention;

FIG. 5 shows a schematic sectional view along the line B—B in FIG. 4;

DETAILED DESCRIPTION OF THE PREFERRED EMBODIMENTS

An actuator 1 according to a first exemplary embodiment of the present invention is disclosed below with reference to FIGS. 1 to 3.

Figure 1:
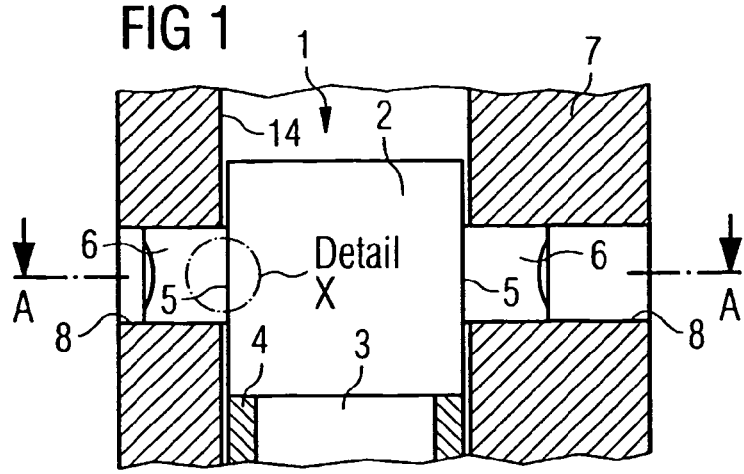
FIG. 1 shows a schematic sectional view of an actuator according to a first exemplary embodiment of the present invention.

As shown in FIG. 1, the actuator 1 is disposed in an assembly hole 14 of an injector housing 7. The actuator 1 comprises a top plate 2, a piezostack 3, which is disposed in a tube spring 4, and a bottom plate (not shown). The actuator 1 is connected in a known manner via the bottom plate to a translation device to translate the actuator lift so that an injection needle of the injector is raised from its seat and fuel is injected into a combustion chamber or such an operation is terminated.

Figure 2:
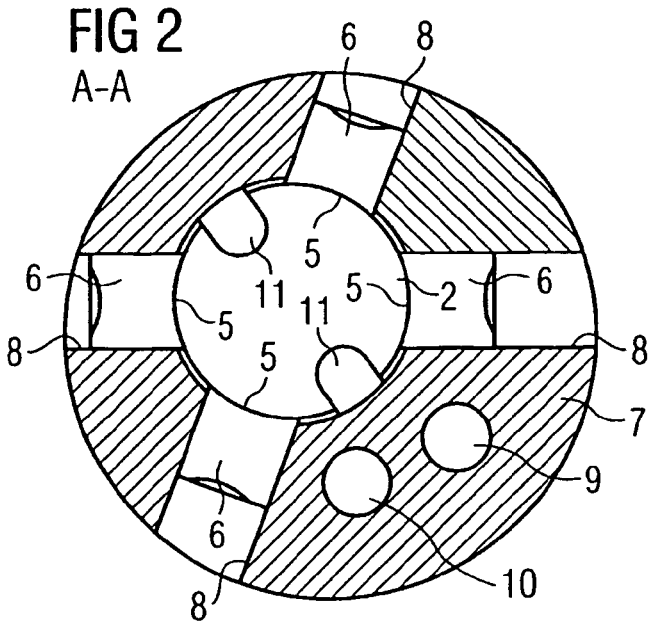
FIG. 2 shows a schematic sectional view along the line A—A in FIG. 1.
Figure 3:
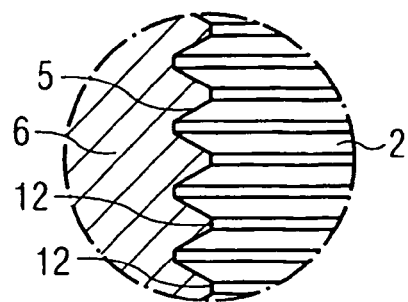
FIG. 3 shows an enlarged detailed view of the detail X in FIG. 1.

As shown in particular in FIGS. 1 and 2, four cutouts 8 are configured in the injector housing 7. The cutouts 8 are in the form of through-holes and open into the assembly hole 14 of the injector housing 7. A filler material 6 is disposed in each of the cutouts 8 and is used to caulk the top plate 2 of the actuator to the injector housing 7. This results in four caulked areas 5 (see FIG. 7) between the top plate 2 and the injector housing 7.

As shown especially in FIG. 2, two caulked areas 5 are disposed in each instance so that they lie opposite each other at 180° on the injector housing 7. This results in optimum application and distribution of forces on the top plate 2. FIG. 3 shows an enlargement of a caulked area 5. As shown in FIG. 3, a plurality of grooves 12 that are disposed parallel to each other are configured on the outer periphery of the top plate 2. The grooves 12 thereby run around the entire outer periphery of the cylindrical top plate 2. These grooves 12 provide a surface structure for the top plate 2, to ensure a suitable profile depth for caulking. As shown in FIG. 3, after the caulking process the filler material 6 is disposed in the grooves 12 so that it can be ensured that the actuator 1 is securely fixed to the injector housing 7.

As shown in FIG. 2, two cable feeds 11 are also provided in the top plate 2 to provide an electrical connection for the piezostack. A high-pressure hole 9 and leakage hole 10 are also provided in the injector housing 7.

In order to fix the actuator 1 prepared as a pre-assembled module in the injector housing 7, the actuator 1 is first disposed in the injector housing in the assembly hole 14. The actuator 1 is thereby positioned so that the bottom plate (not shown) is lined up with its predefined position. The four filler materials 6 are then disposed in the cutouts 8 in the injector housing 7 and caulked by pressure from an extrusion die. This produces four caulked areas 5 between the filler material 6 and the top plate 2 or the filler material 6 and the injector housing 7. A cold extruded steel, which has excellent caulking characteristics, is preferably used as the filler material for caulking.

In this way the actuator 1 can be fixed in the optimum position in the injector, without the need for expensive post-treatments.

According to the invention the disadvantageous accumulation of different tolerances of the individual components can be prevented in particular by caulking. More precisely the manufacturing tolerances of the actuator 1, e.g. length tolerances of the piezostack 3, the top plate 2 or the bottom plate, can be compensated for according to the invention by precise positioning of the pre-assembled actuator in relation to a reference surface disposed in the injector housing 7. Also an electric plug-type connection can be simply anchored in the cutouts 8 after caulking, for example by injecting plastic.

The actuator 1 shown is used especially in an injector for an accumulator injection system, for example a common rail system. The integral disposition of the actuator 1 in the injector housing 7 means that the injector can have especially small and compact dimensions. Also caulking means that a tempering steel can be used resulting in simpler production of both the top plate 2 and the injector housing 7.

An actuator 1 according to a second exemplary embodiment of the present invention is disclosed below with reference to FIGS. 4 and 5. The same reference characters are used for similar parts.

The actuator 1 of the second exemplary embodiment corresponds essentially to that of the first exemplary embodiment. Unlike the first exemplary embodiment, in the second exemplary embodiment however no additional caulking materials are provided but the material 13 of the injector housing 7 is used as the material for caulking. Blind holes 8 are provided for this purpose in the injector housing 7 so that a proportion of material 13 remains at the end of each blind hole and this is used to caulk the top plate 2. Otherwise the actuator of the second exemplary embodiment corresponds to the first exemplary embodiment so reference can be made to the description given for that.

Figure 6:
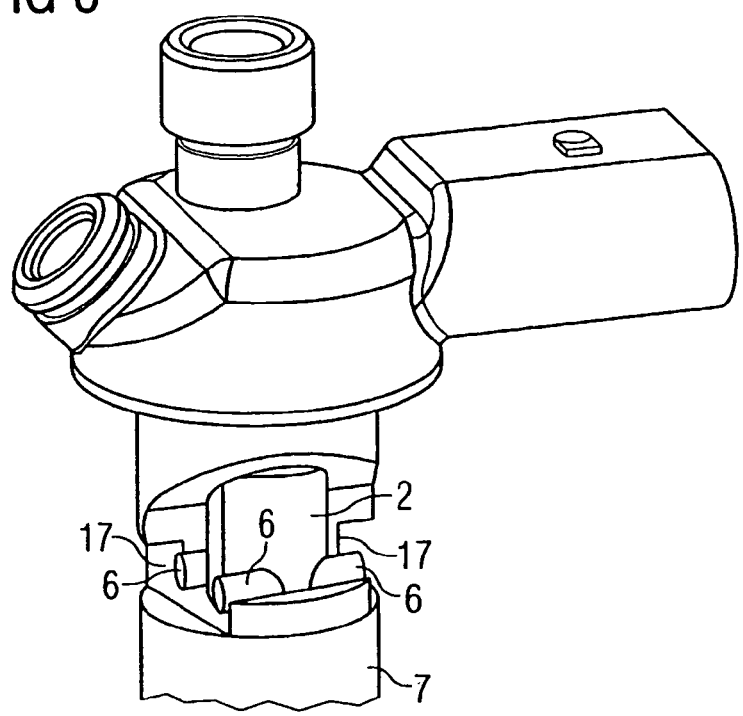
FIG. 6 shows a schematic, perspective, partially sectional view of an injector with an actuator according to a third exemplary embodiment of the present invention.

An actuator according to a third exemplary embodiment of the present invention is disclosed below with reference to FIGS. 6 and 7, whereby similar parts are again allocated the same reference characters as in the previous exemplary embodiments.

The actuator of the third exemplary embodiment corresponds essentially to that of the first exemplary embodiment, whereby instead of radial holes, tangential holes 8 are formed in respect of the outer periphery of the top plate 2. As shown in FIGS. 6 and 7, the cutouts 8 are formed on flattened areas 17 of the injector housing 7. Two cutouts 8 are thereby disposed opposite each other in each instance so that four cutouts 8 can be produced by only two holes, resulting in production cost benefits. The cutouts 8 are thereby formed tangentially in respect of the hole for holding the actuator.

Figure 7:
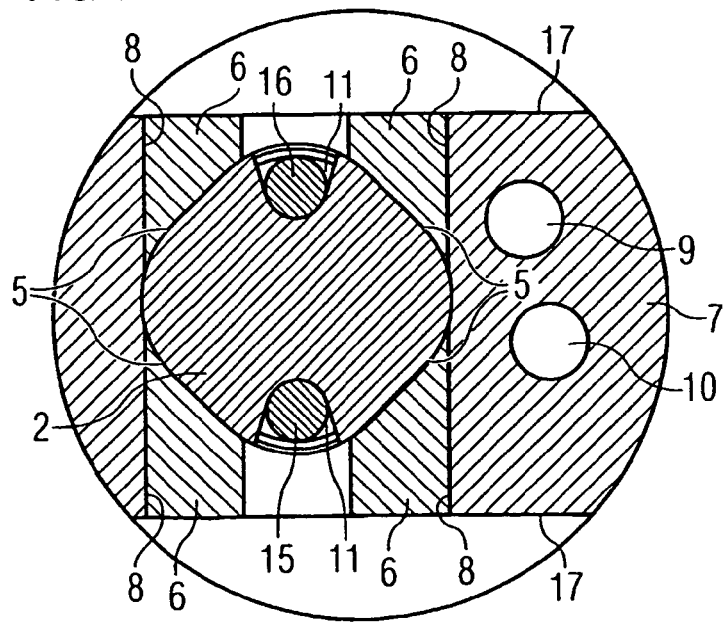
FIG. 7 shows a schematic sectional view of the actuator shown in FIG. 6.

FIG. 7 shows the caulked state of the top plate 2. As shown in FIG. 7, cylindrical caulking pins 6 are used as the caulking material, preferably made of the easily formable material Cq45. After caulking the cylindrical caulking pins 6 are deformed so that they each form wedge-shaped caulked areas 5 between the top plate 2 and the injector housing 7. These wedge-shaped caulked areas 5 abut outwards with the injector housing 7 and inwards with the top plate 2. Caulking thereby takes place essentially tangentially in respect of the outside of the top plate 2. It should be noted that for a better wedge effect the outer periphery of the top plate 2 can be configured with flattened areas. Also a surface structure, for example in the form of ribbing, etc., can be provided on the top plate 2. The flattened areas 17 on the injector housing 7 can also be used as an anchorage point, for example for an electric plug-type connection, etc.

FIG. 7 also shows the cables 15 and 16 located in the cable feeds 11 for the electrical connection of the piezostack.

The present invention therefore relates to an actuator 1 acting as a drive unit for an injector, especially for an accumulator injection system, whereby the actuator comprises a piezostack 3 disposed in a tube spring 4, a top plate 2 and a bottom plate. The top plate 2 of the actuator is fixed directly to an injector housing 7 by means of at least one caulked area 5. Caulking allows the injector to be produced in a simple and economical manner.

The present invention is not restricted to the exemplary embodiments shown. Various differences and modifications can be implemented without departing from the scope of the invention.

We claim:

1. An actuator acting as a drive unit for an injector of an accumulator injection system, the actuator comprising:
    a piezostack disposed in a tube spring;
    a top plate;
    a bottom plate, wherein the top plate of the actuator is fixed directly to an injector housing by caulking;
    a surface structure configured on the top plate having a suitable profile depth for caulking,
    wherein the surface structure on the top plate comprises one or more circumferential grooves.

2. An actuator acting as a drive unit for an injector of an accumulator injection system, the actuator comprising:
    a piezostack disposed in a tube spring;
    a top plate;
    a bottom plate, wherein the top plate of the actuator is fixed directly to an injector housing by caulking;
    a surface structure configured on the top plate having a suitable profile depth for caulking,
    wherein the top plate is a cylinder and the surface structure on the top plate is an external thread.

3. An actuator acting as a drive unit for an injector of an accumulator injection system, the actuator comprising:
- a piezostack disposed in a tube spring;
- a top plate;
- a bottom plate, wherein the top plate of the actuator is fixed directly to an injector housing by caulking, wherein cutouts are provided in the injector housing, at which the caulked areas are disposed.

4. An actuator according to claim 3, wherein the cutouts serve as anchor points for an electric plug-type connection of the actuator.

5. An actuator according to claim 4, wherein the electrical plug-type connection is configured as a plastic extrusion coating.

* * * * *